United States Patent [19]
Tomishima et al.

[11] Patent Number: 5,321,646
[45] Date of Patent: Jun. 14, 1994

[54] LAYOUT OF A SEMICONDUCTOR MEMORY DEVICE

[75] Inventors: Shigeki Tomishima; Mikio Asakura; Kazutami Arimoto; Hideto Hidaka; Masanori Hayashikoshi, all of Hyogo, Japan

[73] Assignee: Mitsubishi Denki Kabushiki Kaisha, Tokyo, Japan

[21] Appl. No.: 865,142

[22] Filed: Apr. 8, 1992

[30] Foreign Application Priority Data

Apr. 9, 1991 [JP] Japan .................................. 3-106788
Feb. 18, 1992 [JP] Japan .................................. 4-30677

[51] Int. Cl.$^5$ .......................... G11C 5/02; G11C 8/00
[52] U.S. Cl. ........................................ 365/51; 365/63; 365/226
[58] Field of Search ............... 365/51, 63, 226, 230.03

[56] References Cited

U.S. PATENT DOCUMENTS 4,535,423  8/1985  Nozaki et al. ......................... 365/51

FOREIGN PATENT DOCUMENTS 0155521  9/1985  European Pat. Off. .
3114001  8/1982  Fed. Rep. of Germany .
2-3147   1/1990  Japan .
2-177360 7/1990  Japan .
3-97193  4/1991  Japan .

OTHER PUBLICATIONS

Okumura et al., "Decoded-Sense Amplifier for High-Density DRAMs", pp. 103–104, Digest Paper of VLSI Circuits Symposium, May 25, 1989.

Primary Examiner—Joseph A. Popek
Attorney, Agent, or Firm—Lowe, Price, LeBlanc & Becker

[57] ABSTRACT

A power supply line is disposed parallel to a sense amplifier train including a plurality of sense amplifiers at the side of each subarray. The power supply line is connected to the sense amplifier included in the sense amplifier train via a plurality of drive transistors and a sense amplifier drive line.

40 Claims, 10 Drawing Sheets

LAYOUT OF A SEMICONDUCTOR MEMORY DEVICE

BACKGROUND OF THE INVENTION

1. Field of the Invention

The present invention relates to semiconductor memory devices, and more particularly, to a layout of a semiconductor memory device.

2. Description of the Background Art

FIG. 8 shows a layout of an entire chip of a conventional 4M bit dynamic random access memory (referred to as DRAM hereinafter).

Referring to FIG. 8, two 2M bit memory array blocks 2A and 2B are formed on a semiconductor substrate 1. Each of memory array blocks 2A and 2B comprises eight 256K-bit subarrays 3. A column decoder 4 is allocated between memory array blocks 2A and 2B. A row decoder 5A and a row decoder 5B are allocated at the sides of memory array blocks 2A and 2B, respectively. Power supply lines Vcc and Vss are arranged at the peripheral edge of semiconductor substrate 1.

FIG. 9 shows a detailed structure of region A of FIG. 8. Subarray 3 comprises a plurality of bit lines BL and $\overline{BL}$, a plurality of word lines WL crossing the plurality of bit lines, and a plurality of memory cells MC provided at crossings of the plurality of bit lines BL and $\overline{BL}$ and the plurality of word lines WL. The plurality of bit lines form a plurality of bit line pairs BL and $\overline{BL}$.

A plurality of sense amplifiers 6 are provided corresponding to the plurality of bit line pairs BL and $\overline{BL}$. Each sense amplifier 6 is connected to a corresponding bit line pair BL and $\overline{BL}$. The plurality of sense amplifiers 6 are arranged in a direction perpendicular to bit lines BL and $\overline{BL}$ to form a sense amplifier train (sense amplifier group).

The plurality of sense amplifiers 6 are connected to sense amplifier drive lines SP and SN. Sense amplifier drive line SP is connected to power supply line Vcc extending parallel to bit lines BL and $\overline{BL}$ via a drive transistor 7 formed of a P channel MOS transistor. Sense amplifier drive line SN is connected to power supply line Vss extending parallel to bit lines BL and $\overline{BL}$ via a drive transistor 8 formed of an N channel MOS transistor.

The gate of drive transistor 7 is connected to signal line $\overline{SO}$ for receiving a sense amplifier activation signal. The gate of drive transistor 8 is connected to signal line SO for receiving a sense amplifier activation signal.

FIG. 10 shows a detailed structure of the sense amplifier. Sense amplifier 6 comprises N channel MOS transistors 61 and 62, and P channel MOS transistors 63 and 64.

The drain of transistor 61 is connected to bit line BL and the drain of transistor 62 is connected to bit line $\overline{BL}$. Both the sources of transistors 61 and 62 are connected to node n1. The gate of transistor 61 is connected to bit line $\overline{BL}$, and the gate of transistor 62 is connected to bit line BL. The drain of transistor 63 is connected to bit line BL, and the drain of transistor 64 is connected to bit line $\overline{BL}$. Both the sources of transistors 63 and 64 are connected to node n2. The gate of transistor 63 is connected to bit line $\overline{BL}$, and the gate of transistor 64 is connected to bit line BL. Node n1 is connected to sense amplifier drive line SN, and node n2 is connected to sense amplifier drive line SP.

The fall of potential of sense amplifier drive line SN to a low level (logical low) causes the lower potential of bit lines BL and $\overline{BL}$ to attain a low level. A rise of potential of sense amplifier drive line SP to a high level (logical high) causes the higher potential of bit lines BL and $\overline{BL}$ to attain a high level. Thus, the potential difference between bit lines BL and $\overline{BL}$ is amplified.

The operation of the DRAM shown in FIGS. 8 and 9 will be explained hereinafter.

Row decoders 5A and 5B select any of the plurality of word lines WL to pull the potential of that word line WL to a high level. This turns on the transfer gates in the plurality of memory cells MC connected to the selected word line WL, whereby data is read out to the corresponding bit line BL or $\overline{BL}$ from the memory cells MC. As a result, charge flows to the bit lines BL or $\overline{BL}$ to change the potential thereof. Thus, potential difference is generated between bit lines BL and $\overline{BL}$ of each pair.

When the sense amplifier activation signal applied to signal line SO attains a high level, drive transistor 8 is turned on. This causes the power supply potential of low level on power supply line Vss to be provided to sense amplifier drive line SN. As a result, each sense amplifier 6 pulls down the lower potential of bit lines BL and $\overline{BL}$ to a low level.

When the sense amplifier activation signal applied to signal line $\overline{SO}$ attains a low level, drive transistor 7 is turned on. This causes the power supply potential of high level on power supply line Vcc to be provided to sense amplifier drive line SP. As a result, each sense amplifier 6 pulls up the higher potential of bit lines BL and $\overline{BL}$ to a high level. Thus, the sense operation of each sense amplifier 6 is carried out.

Increase in integration density and capacity of a DRAM results in the increase of sense amplifiers 6 connected to each sense amplifier drive lines SP and SN and increase in the length of each sense amplifier drive lines SP and SN.

Accordingly, the sensing time of a sense amplifier 6 located remote from drive transistors 7 and 8 becomes longer. A location remote from drive transistors 7 and 8 has a disadvantage that the pull up/down of the potential of sense amplifier drive lines SP and SN is not sufficient. This means that a sense amplifier 6 located remote from drive transistors 7 and 8 cannot sufficiently amplify the potential difference on bit lines BL and $\overline{BL}$. This may result in an erroneous operation.

SUMMARY OF THE INVENTION

An object of the present invention is to ensure proper operation of a sense amplifier, and to reduce sensing time and improve sensitivity thereof.

Another object of the present invention is to provide a layout of a semiconductor memory device having all sense amplifiers driven sufficiently and at similar levels without variation in sensing time independent of the location of the sense amplifier.

A semiconductor memory device according to the present invention is a semiconductor memory device formed on a semiconductor substrate, including a memory array, a plurality of sense amplifier groups, a power supply line, and a plurality of drivers.

The memory array includes a plurality of subarrays arranged along a first direction. The plurality of sense amplifier groups are provided corresponding to the plurality of subarrays. The power supply line receives a predetermined power supply potential. The plurality of drivers are provided corresponding to the plurality of subarrays. Each of the plurality of drivers receive the power supply potential of the power supply line to drive a corresponding sense amplifier group.

Each of the plurality of subarrays includes a plurality of bit lines disposed parallelly in a first direction, a plurality of word lines crossing the plurality of bit lines, and a plurality of memory cells provided at crossings of the plurality of bit lines and the plurality of word lines. Each of the plurality of sense amplifier groups includes a plurality of sense amplifiers connected to the plurality of bit lines in a corresponding subarray. The plurality of sense amplifiers are arranged along a second direction perpendicular to the first direction.

The power supply line includes a plurality of first interconnection portions provided corresponding to the plurality of subarrays. Each of the plurality of first interconnection portions are disposed parallel to the second direction at the side of a corresponding subarray. Each of the plurality of drivers includes a plurality of drive circuits connected between a plurality of sense amplifiers in a corresponding sense amplifier group and a corresponding first interconnection portion.

Each of the plurality of drive circuits may be connected to one sense amplifier in a corresponding sense amplifier group.

Each of the plurality of drive circuits may be connected to a predetermined number of or all of the sense amplifiers in a corresponding sense amplifier group via a drive line.

The power supply line may further include a second interconnection portion disposed parallel to the first direction across the memory array. The second interconnection portion is connected to the plurality of first interconnection portions at the crossings thereof.

The semiconductor memory device has a first interconnection portion of a power supply line in parallel to the plurality of sense amplifiers at the side of each subarray, and a plurality of drive circuits connected between the plurality of sense amplifiers and the first interconnection portion. Therefore, the distance between the power supply line and each sense amplifier is reduced and is identical. The effective number of sense amplifiers connected to each drive circuit is also reduced.

As a result, variation in sensing time depending on the position of sense amplifier is eliminated and all the sense amplifiers are driven sufficiently and at a similar level. This ensures proper sense operation of the sense amplifier. Furthermore, reduction in sensing time and improvement in sensitivity are achieved.

It is advantageous to provide a second interconnection portion intersecting the plurality of first interconnection portions in that the provision of the potential of the first interconnection is made sufficient.

A semiconductor memory device according to another aspect of the present invention is a semiconductor memory device formed on a semiconductor substrate, including a memory array, a plurality of sense amplifier groups, a power supply line, and a plurality of drivers.

The memory array includes a plurality of subarrays arranged along a first direction. The plurality of sense amplifier groups are provided corresponding to the plurality of subarrays. The power supply line receives a predetermined power supply potential. The plurality of drivers are provided corresponding to the plurality of subarrays. Each of the plurality of drivers receive the power supply potential of the power supply line to drive a corresponding sense amplifier group.

Each of the plurality of subarrays includes a plurality of bit lines arranged in parallel in the first direction, a plurality of word lines crossing the plurality of bit lines, and a plurality of memory cells provided at crossings of the plurality of bit lines and the plurality of word lines. Each of the plurality of subarrays is divided into a plurality of memory cell regions arranged along a second direction perpendicular to the first direction.

Each of the plurality of sense amplifier groups includes a plurality of amplifiers connected to a plurality of bit lines in a corresponding subarray. The plurality of sense amplifiers are arranged along the second direction. The power supply line includes a first interconnection portion provided commonly to the plurality of subarrays. The first interconnection portion is arranged parallel to the second direction at one side of the plurality of subarrays.

Each of the plurality of drivers includes a plurality of drive circuits provided corresponding to the plurality of memory cell regions in a corresponding subarray.

Each of the plurality of drive circuits is connected between a plurality of sense amplifiers connected to a corresponding memory cell region and the first interconnection portion.

The power supply line may further include a second interconnection portion disposed parallel to the first direction so as to traverse the memory array. The second interconnection portion is connected to the plurality of first interconnections at the crossings thereof.

The semiconductor memory device has the interconnection portions of the power supply line extending parallel to the plurality of sense amplifiers at one side of one of the plurality of subarrays, and has respective drive circuits connected between the plurality of sense amplifiers connected to each memory cell region of each subarray and the first interconnection portions. Therefore, the distance between the power supply line and each sense amplifier is reduced and is identical. Also, the effective number of sense amplifiers connected to each drive circuit is reduced. Variation in sensing time depending on the location of the sense amplifier is eliminated, and all the sense amplifiers are driven sufficiently and at similar levels.

The provision of a second interconnection portion crossing the first interconnection portions gives the advantage that the potential of the first interconnections is made sufficient.

A semiconductor memory device according to a further aspect of the present invention is a semiconductor memory device formed on a semiconductor substrate, including a plurality of memory array blocks, a plurality of sense amplifier groups, a power supply line, a plurality of drivers, and a logic peripheral circuit.

The plurality of memory array blocks are arranged along a first direction. Each of the plurality of memory array blocks includes a plurality of subarrays arranged along the first direction. The plurality of sense amplifier groups are provided corresponding to the plurality of subarrays. The power supply line receives a predetermined power supply potential.

The plurality of drivers are provided corresponding to the plurality of subarrays. Each of the plurality of drivers receives the power supply potential of the power supply line to drive a corresponding sense amplifier group. The logic peripheral circuit is provided between two adjacent memory array blocks to drive and control the plurality of memory array blocks.

Each of the plurality of subarrays includes a plurality of bit lines arranged parallel to the first direction, a plurality of word lines crossing the plurality of bit lines, and a plurality of memory cells provided at crossings of the plurality of bit lines and the plurality of word lines.

Each of the plurality of sense amplifier groups includes a plurality of sense amplifiers connected to the plurality of bit lines in a corresponding subarray. The plurality of sense amplifiers are arranged along a second direction perpendicular to the first direction.

The power supply line includes a plurality of first interconnection portions arranged in parallel to the second direction at the side of the plurality of subarrays, and a second interconnection portion disposed in parallel to the first direction to traverse the plurality of memory arrays and the logic peripheral circuit.

Each of the plurality of drivers includes a plurality of drive circuits connected between the plurality of sense amplifiers in a corresponding sense amplifier group and any of the plurality of first interconnection portions.

The semiconductor memory device has the first interconnection portions of the power supply line extend parallel to the plurality of sense amplifiers at the side of the plurality of subarrays, and a plurality of drive circuits connected between the plurality of sense amplifiers and the first interconnection portions. Therefore, the distance between the power supply line and each sense amplifier is reduced and made equal. Also, the effective number of sense amplifiers connected to each drive circuit is reduced.

As a result, variation in sensing time depending on the position of the sense amplifier is eliminated, and all the sense amplifiers are driven sufficiently and at similar levels.

The second interconnection portion extends to traverse of the plurality of memory arrays and the logic peripheral circuit. Therefore, the provision of the potential from the first interconnection portion is made sufficient by the second interconnection portion. Furthermore, leading wires for providing power supply potential to the second interconnection portion are not required in each memory array. Therefore, it is possible to reduce the area penalty (an area that cannot be used by other circuits of leading wires.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

(1) First Embodiment

Figure 1:
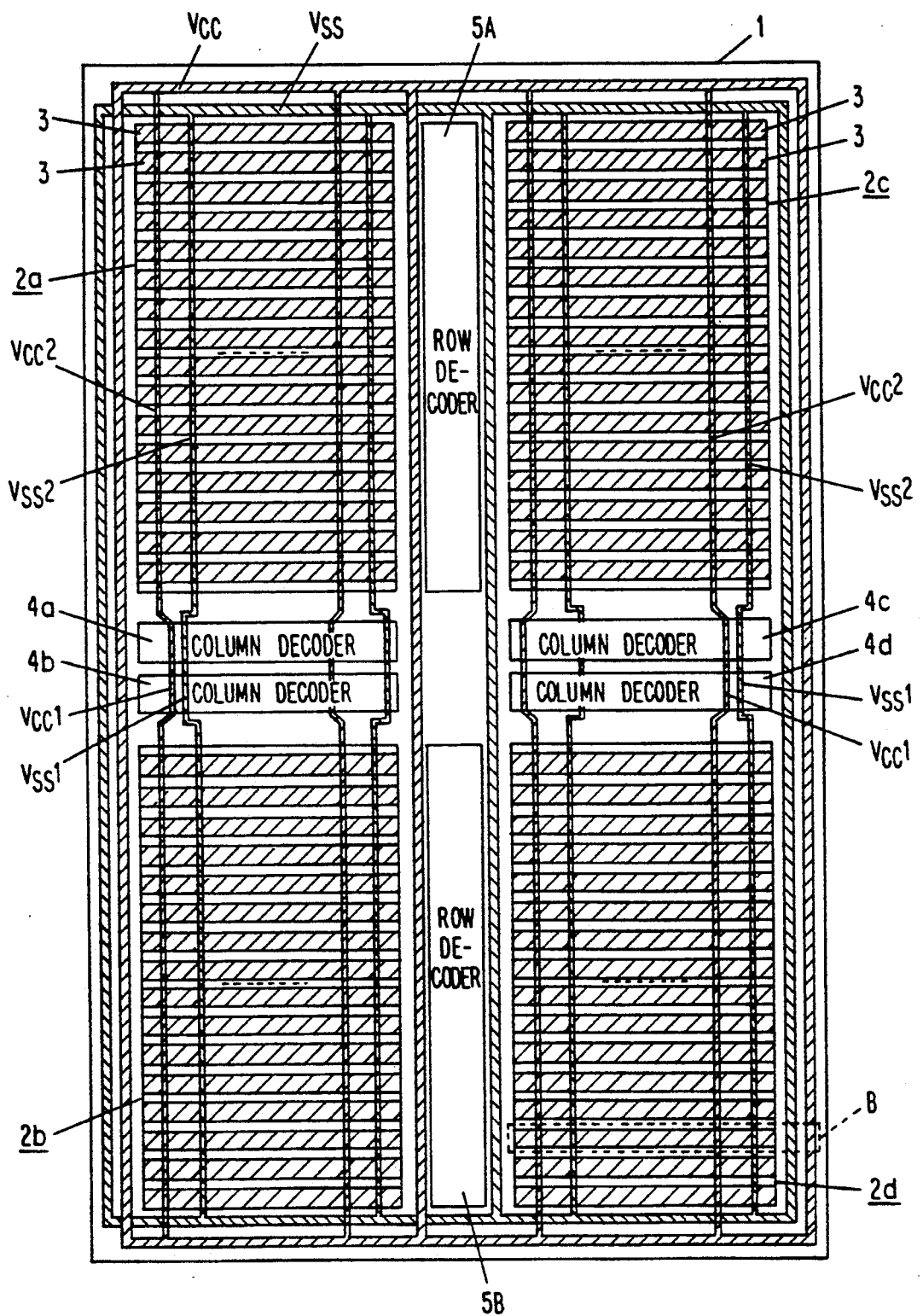
FIG. 1 is a diagram showing a chip layout of a DRAM according to an embodiment of the present invention.

FIG. 1 shows a layout of the entire chip of a 16M bit DRAM according to a first embodiment of the present invention.

Referring to FIG. 1, four 4M-bit memory array blocks 2a, 2b, 2c and 2d are formed on a semiconductor substrate 1. Each of memory array blocks 2a, 2b, 2c, and 2d includes sixteen 256K-bit subarrays 3. Subarrays 3 are arranged along a direction (first direction) parallel to the bit line.

Between memory array blocks 2a and 2b, memory array blocks 2c and 2d, memory array blocks 2a and 2c, and memory array blocks 2b and 2d, logic peripheral circuits for driving and controlling memory array blocks 2a, 2b, 2c, 2d and other circuits on semiconductor substrate 1 are provided. FIG. 1 shows column decoders 4a, 4b, 4c and 4d, and row decoders 5A and 5B included in the logic peripheral circuit.

Column decoders 4a and 4b are arranged between memory array blocks 2a and 2b. Column decoders 4c and 4d are arranged between memory array blocks 2c and 2d. Row decoder 5A is arranged between memory array blocks 2a and 2c. Row decoder 5B is arranged between memory array blocks 2b and 2d.

A power supply line Vcc for receiving power supply potential corresponding to a high level and a power supply line Vss for receiving power supply potential corresponding to a low level are arranged at the peripheral edge portion of semiconductor substrate 1. A plurality of power supply lines Vcc2 and Vss2 are disposed so as to traverse memory array blocks 2a, 2b, 2c, and 2d. One ends of power supply lines Vcc2 and Vss2 are connected to power supply lines Vcc and Vss, respectively. The other ends of power supply lines Vcc2 and Vss2 are connected to power supply lines Vcc1 and Vss1 crossing the logic peripheral circuits including column decoders 4a, 4b, 4c and 4d.

Thus, a plurality of power supply lines are disposed extending continuously from the power supply line Vcc of one shorter side of semiconductor substrate 1 to the power supply line Vcc of the other shorter side of semiconductor substrate 1. Similarly, a plurality of power supply lines are disposed extending continuously from the power supply line Vss of one of the shorter side to the power supply line Vss of the other shorter side of semiconductor substrate 1.

Power supply lines Vcc and Vcc1 and power supply lines Vss and Vss1 are formed of a first aluminum layer, and power supply lines Vcc2 and Vss2 are formed of a second aluminum layer.

Figure 2:
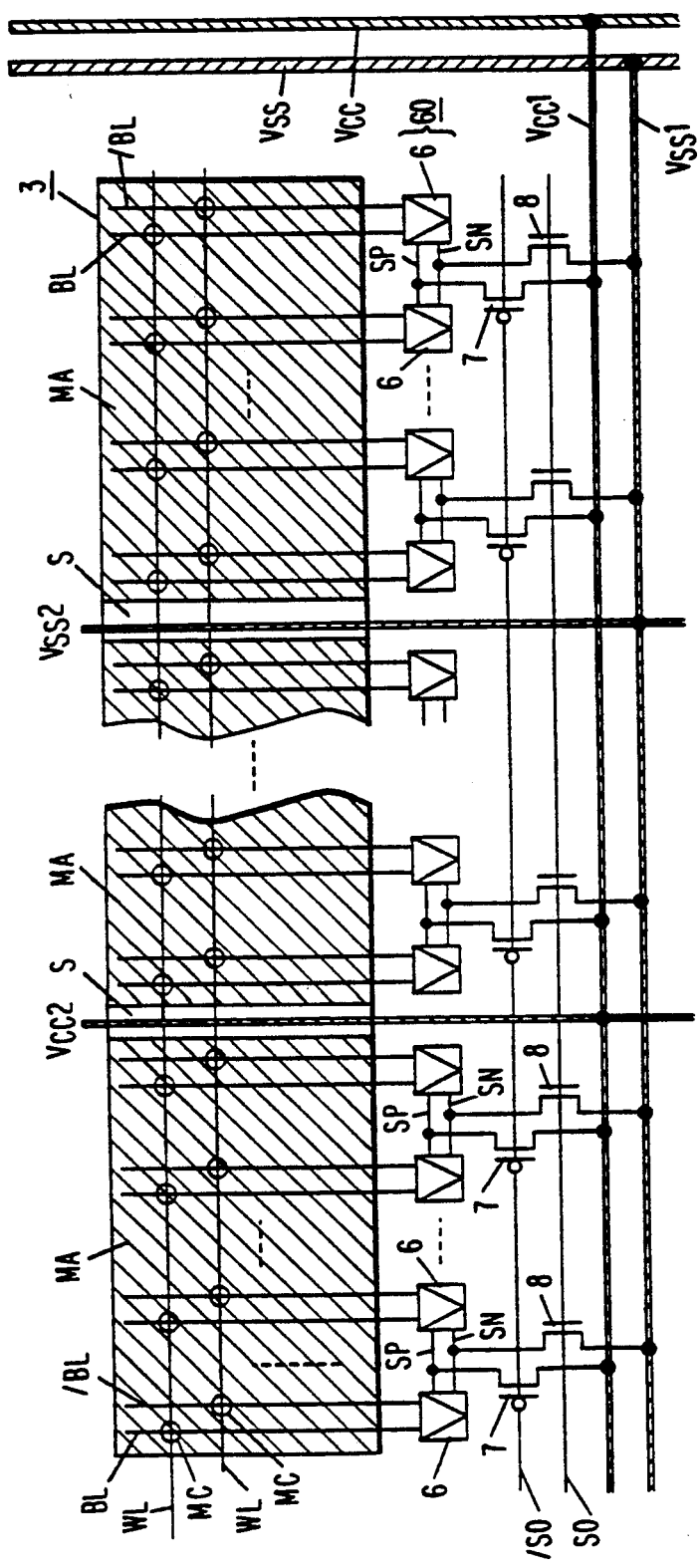
FIG. 2 is a diagram showing in detail a structure of a portion of the DRAM of FIG. 1.

FIG. 2 shows a detailed structure of region B of FIG. 1.

Referring to FIG. 2, subarray 3 comprises a plurality of bit lines BL and $\overline{BL}$, a plurality of word lines WLS crossing the plurality of bit lines, and a plurality of dynamic memory cells MCS provided at the intersections of the plurality of bit lines BL and $\overline{BL}$ and the plurality of word lines WL. The plurality of bit lines form a plurality of bit line pairs of BL and $\overline{BL}$.

Subarray 3 has a plurality of shunt regions S extending parallel to bit lines BL and $\overline{BL}$. Subarray 3 is divided into a plurality of memory cell regions MA by these shunt regions S.

A plurality of sense amplifiers 6 are provided corresponding to the plurality of bit line pairs BL and $\overline{BL}$. Each sense amplifier 6 is connected to one end of a corresponding bit line pair BL and $\overline{BL}$. The plurality of sense amplifiers 6 are arranged along a direction (second direction) perpendicular to bit line pairs BL and $\overline{BL}$ to form a sense amplifier train (sense amplifier group) 60.

Power supply lines Vcc1 and Vss1 are disposed along a direction perpendicular to bit line pairs BL and $\overline{BL}$. Power supply lines Vcc1 and Vss1 are connected to power supply lines Vcc and Vss, respectively.

Using shunt regions S, a plurality of power supply lines Vcc2 and a plurality of power supply lines Vss2 are disposed alternately parallel to bit lines BL and $\overline{BL}$. Power supply lines Vcc2 and Vss2 are connected at the respective intersections of power supply lines Vcc1 and Vss1 disposed perpendicular to bit lines BL and $\overline{BL}$.

Two adjacent sense amplifiers 6 are connected to each other by a pair of sense amplifier drive lines SP and SN disposed along a direction perpendicular to bit line pairs BL and $\overline{BL}$. Each pair of sense amplifier drive lines SP and SN is connected to power supply lines Vcc1 and Vss1, respectively, via a drive transistor 7 implemented with a P channel MOS transistor and a drive transistor 8 implemented with an N channel MOS transistor, respectively.

Each drive transistor 7 has its gate connected to signal line $\overline{SO}$ for receiving a sense amplifier activation signal. Each drive transistor 8 has its gate connected to signal line SO for receiving sense amplifier activation signal. Similar to power supply lines Vcc1 and Vss1, signal lines SO and $\overline{SO}$ are arranged in a direction perpendicular to bit line pairs BL and $\overline{BL}$.

Figure 3:
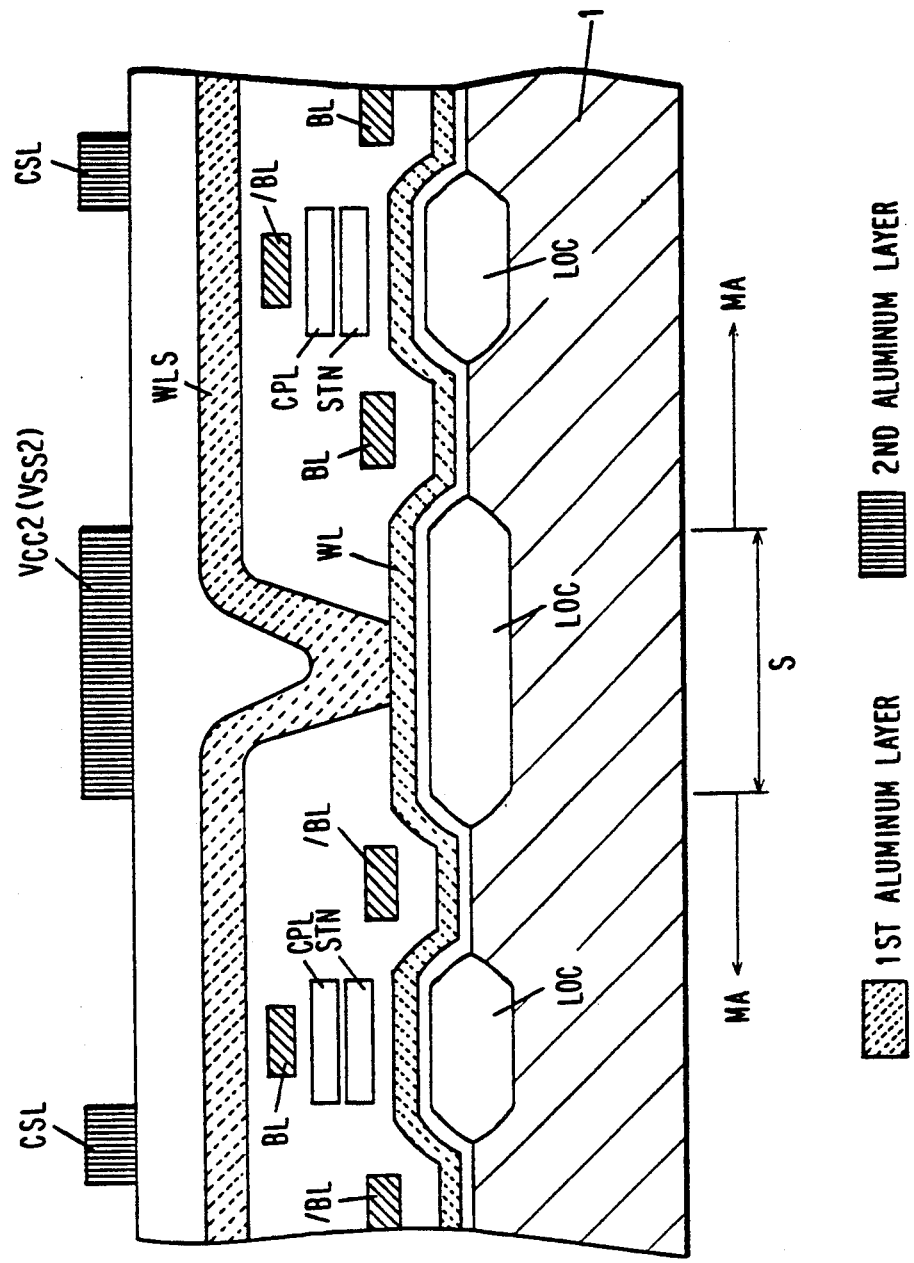
FIG. 3 is a partial sectional view of a subarray of FIG. 2.

FIG. 3 shows a partial sectional view of shunt region S and the peripheral region of subarray 3.

Referring to FIG. 3, a LOCOS (Local Oxidization of Silicon) film is formed at a predetermined region on semiconductor substrate 1. A word line WL of a polysilicon layer is formed on semiconductor substrate 1. Bit lines BL and $\overline{BL}$ are disposed to cross word lines WL at right angles. A shunt interconnection WLS of a first aluminum layer is provided parallel to word line WL. Shunt interconnection WLS is connected to word line WL at a predetermined location.

As described above, word line WL is formed of a polysilicon layer having high resistance in accordance with increase of capacity of a memory. A longer word line WL will result in a greater resistance. Shunt interconnection WLS formed of the first aluminum layer is used to reduce the resistance of word line WL.

The region for connecting shunt interconnection WLS to word line WL is called shunt region S. The region excluding shunt region S is called the memory cell region MA.

A plurality of column selecting lines CSL formed of a second aluminum layer are disposed parallel to bit lines BL and $\overline{BL}$ above shunt interconnection WLS. Column selecting lines CSL are disposed to traverse the plurality of subarrays 3 in the memory array block so that the column decoder (refer to FIG. 1) can select any of the plurality of bit line pairs BL and $\overline{BL}$.

Power supply line Vcc2 (or Vss2) of the second aluminum layer is formed above shunt region S. Power supply line Vcc2 is connected to power supply line Vcc1 (refer to FIG. 2) by a contact hole, for example.

As shown in FIG. 2, the present embodiment has power supply lines Vcc1 and Vss1 extending parallel to sense amplifier train 60 so that the distance from power supply lines Vcc1 and Vss1 to each amplifier is reduced and identical. Only two sense amplifiers 6 are connected to one set of drive transistors 7 and 8 and one set of sense amplifier drive lines SP and SN.

Therefore, variation in sensing time depending on the position of sense amplifier 6 is eliminated and the pull up/pull down of potentials of sense amplifier drive lines SP and SN by drive transistors 7 and 8 can be carried out sufficiently. As a result, proper sense operation is ensured.

Power supply lines Vcc2 and Vss2 are disposed utilizing shunt region S. This eliminates the need of additional regions to provide power supply lines Vcc2 and Vss2 parallel to bit lines BL and $\overline{BL}$. It is also possible to enlarge the width of power supply lines Vcc2 and Vss2. By virtue of power supply lines Vcc2 and Vss2, the provision of potentials of power supply lines Vcc1 and Vss1 disposed in a direction perpendicular to bit lines BL and $\overline{BL}$ is made sufficient.

Although power supply lines Vcc2 and Vss2 are alternately disposed in each shunt region S in the above embodiment, the location of power supply lines Vcc2 and Vss2 is not limited to shunt region S. They may be disposed on memory cell region MA, for example.

Also, it is not necessary to provide a power supply line Vcc2 or Vss2 in all the shunt regions S. Power supply line Vcc2 or Vss2 may be provided in any of the plurality of shunt regions.

It is not necessary to alternately dispose power supply lines Vcc2 and Vss2. The power supply lines of Vcc2 and Vss2 may be combined in an arbitrary manner.

Although two sense amplifiers 6 are connected to a pair of sense amplifier drive lines SP and SN in the above embodiment, the number of sense amplifies 6 connected to the pair of sense amplifier drive lines SP and SN is not limited to 2. An arbitrary number of sense amplifiers 6 may be connected to the pair of sense amplifier drive lines SP and SN, such as three sense amplifiers 6, or four sense amplifiers 6.

It is possible to connect all the sense amplifiers 6 corresponding to one memory cell region MA to one pair of sense amplifier drive lines SP and SN. It is also possible to connect all the sense amplifiers 6 corresponding to one subarray 3 to the pair of sense amplifier driver lines SP and SN.

Although one pair of drive transistors 7 and 8 is connected to one pair of sense amplifier drive lines SP and SN in the above-described embodiment, the number of drive transistors connected to one pair of sense amplifier drive lines SP and SN is not limited. A plurality of pairs of drive transistors 7 and 8 may be connected to one pair of sense amplifier drive lines SP and SN. When all the sense amplifiers 6 corresponding to one memory cell region MA are connected to one pair of sense amplifier drive lines SP and SN, a pair of drive transistors 7 and 8 may be provided for each memory cell region MA.

Although one pair of drive transistors 7 and 8 are provided for every two sense amplifiers in the above embodiment, one pair of drive transistors 7 and 8 may be directly connected to one sense amplifier 6. In this case, sense amplifier drive lines SP and SN are not required.

(2) Second Embodiment

Figure 4:
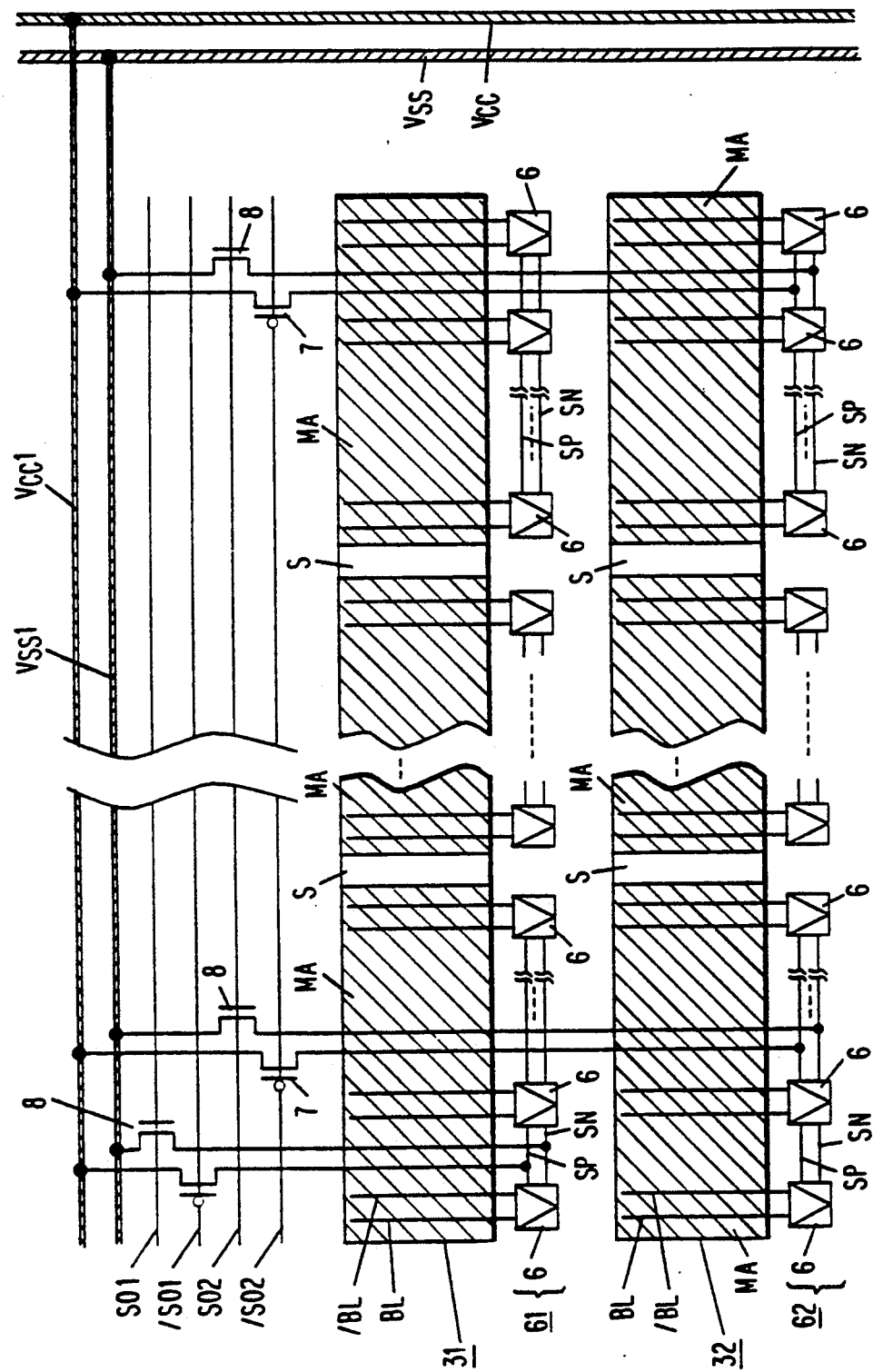
FIG. 4 is a diagram showing a detailed structure of a portion of a DRAM according to a second embodiment of the present invention.

FIG. 4 is a diagram showing a detailed structure of a portion of a 16M-bit DRAM according to a second embodiment of the present invention. The layout of the entire chip of the DRAM of the present embodiment is similar to that shown in FIG. 1.

Referring to FIG. 4, the structures of subarrays 31 and 32 are similar to that of subarray 3 shown in FIG. 2. In FIG. 4, word line WL and memory cell MC are not shown.

Power supply lines Vcc1 and Vss1 are provided in common to subarrays 31 and 32. Power supply lines Vcc1 and Vss1 are disposed in a direction perpendicular to bit lines BL and $\overline{BL}$ at the side of subarray 31. Power supply lines Vcc1 and Vss1 are connected to power supply lines Vcc and Vss, respectively.

A sense amplifier train (sense amplifier group) 61 including a plurality of sense amplifiers 6 is disposed along a direction perpendicular to bit lines BL and $\overline{BL}$ at one side of subarray 31. A sense amplifier train (sense amplifier group) 62 implemented with a plurality of sense amplifiers 6 is disposed along a direction perpendicular to bit lines BL and $\overline{BL}$.

In sense amplifier trains 61 and 62, all the sense amplifiers 6 corresponding to one memory cell region MA are connected by one pair of sense amplifier drive lines SP and SN. One pair of drive transistors 7 and 8 is provided corresponding to each memory cell region MA. Each pair of sense amplifier drive lines SP and SN extends in a direction parallel to bit lines BL and $\overline{BL}$ to be connected to power supply lines Vcc1 and Vss1 via a corresponding pair of drive transistors 7 and 8.

The gates of drive transistors 7 and 8 corresponding to subarray 31 are connected to signal lines $\overline{SO1}$ and SO1 for respectively receiving sense amplifier activation signals. The gates of drive transistors 7 and 8 corresponding to subarray 32 are connected to signal lines $\overline{SO2}$ and SO2 for respectively receiving sense amplifier activation signals. Similar to power supply lines Vcc1 and Vss1, signal lines $\overline{SO1}$, SO1, $\overline{SO2}$, and are arranged along a direction perpendicular to bit lines BL and $\overline{BL}$.

Although not shown in FIG. 4, power supply lines Vcc2 and Vss2 may be disposed parallel to bit lines BL and $\overline{BL}$ in shunt region S, as in the embodiment of FIG. 2.

The above-described embodiment has power supply lines Vcc1 and Vss1 extending parallel to the plurality of sense amplifiers 6, so that the distance from power supply lines Vcc1 and Vss1 to each sense amplifier 6 is reduced and equal. Because only the sense amplifiers 6 corresponding to one memory cell region MA are connected to one pair of sense amplifier drive lines SP and SN, the number of sense amplifiers 6 connected to one pair of drive transistors 7 and 8 is reduced.

Therefore, variation in sensing time depending on the location of sense amplifier 6 is eliminated, and the pull up/pull down of the potential of sense amplifier drive lines SP and SN by drive transistors 7 and 8 can be carried out sufficiently. As a result, proper sense operation can be ensured.

Although a plurality of sense amplifiers 6 corresponding to one memory cell region MA are connected to one pair of sense amplifier drive lines SP and SN in the above-described embodiment, the number of sense amplifiers 6 connected to one pair of sense amplifier drive lines SP and SN is not limited. An arbitrary number of sense amplifiers 6 may be connected to the pair of sense amplifier drive lines SP and SN, such as two sense amplifiers 6, and three sense amplifiers 6. In this case, it is necessary to increase the number of drive transistors 7 and 8 corresponding to the increase of numbers of sense amplifier drive lines SP and SN.

In the above embodiment, sense amplifier drive lines SP and SN are divided corresponding to shunt regions S. Shunt region S and the region between sense amplifiers 6 corresponding to shunt region S can be used for other circuits. However, all the sense amplifiers 6 included in each sense amplifier train corresponding to each subarray may be connected by a continuing pair of sense amplifier drive lines SP and SN. In this case, it is necessary to provide at least one or more drive transistors 7 and 8 for each memory cell region MA.

(3) Third Embodiment

Figure 5:
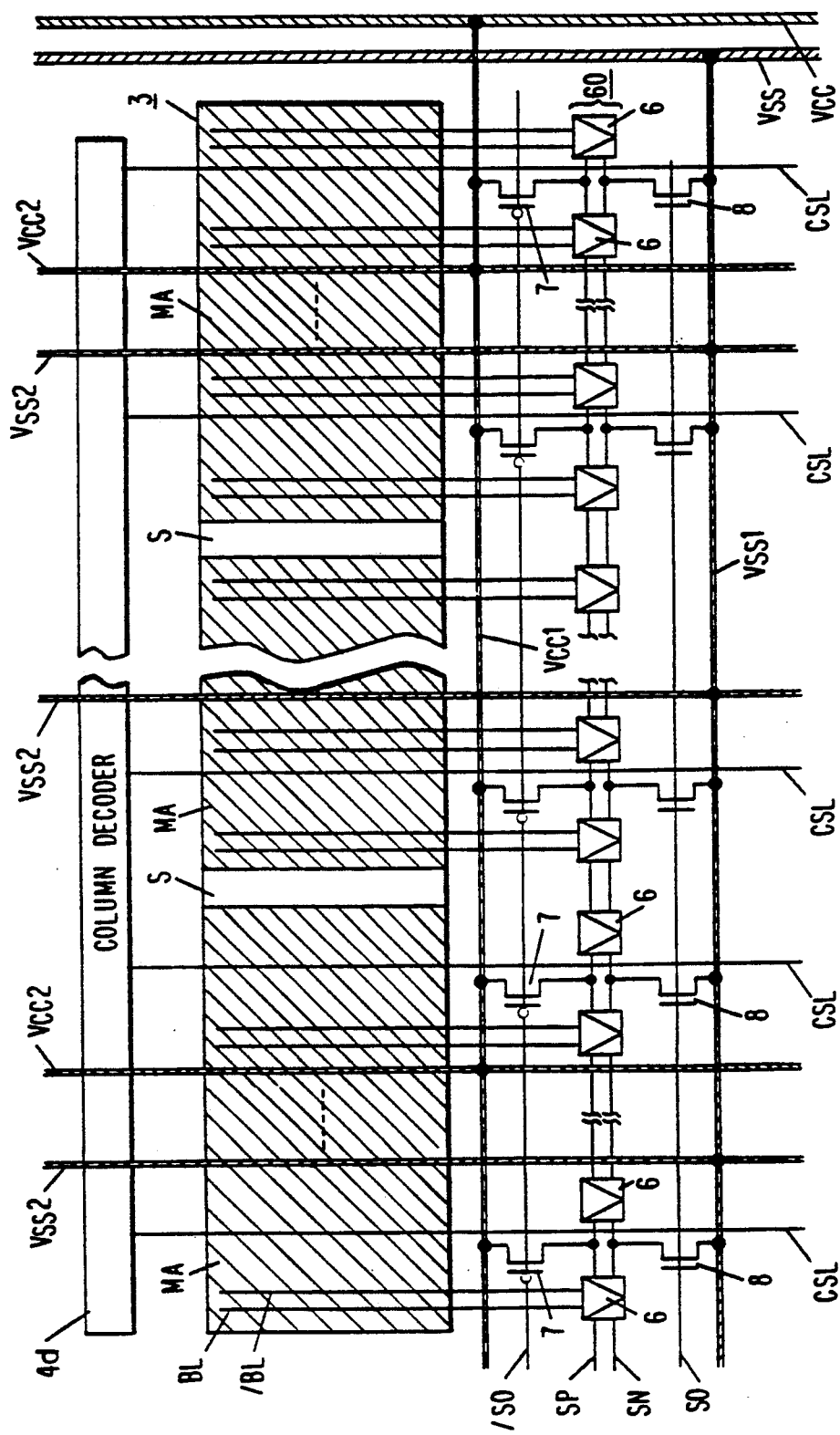
FIG. 5 is a diagram showing a detailed structure of a portion of a DRAM according to a third embodiment of the present invention.

FIG. 5 is a diagram showing a detailed structure of a portion of a 16M-bit DRAM according to a third embodiment of the present invention. The layout of the entire chip of the DRAM of the present embodiment is similar to that of FIG. 1.

Referring to FIG. 5, the structure of subarray 3 is similar to that of subarray 3 shown in FIG. 2. In FIG. 5, word line WL and memory cell MC are not shown.

Sense amplifier train (sense amplifier group) 60 implemented with a plurality of sense amplifiers 6 are disposed along a direction perpendicular to bit line pairs BL and $\overline{BL}$ at one side of subarray 3. Along sense amplifier train 60, power supply lines Vcc1 and Vss1 are disposed. Power supply lines Vcc1 and Vss1 are connected to power supply lines Vcc and Vss, respectively.

All the sense amplifiers 6 included in sense amplifier train 60 are connected by one pair of sense amplifier drive lines SP and SN. Sense amplifier drive lines SP and SN are connected to power supply lines Vcc1 and Vss1, respectively, via a plurality of pairs of drive transistors 7 and 8.

The gates of drive transistors 7 and 8 are connected to signal lines $\overline{SO}$ and SO, respectively, for receiving sense amplifier activation signals. Similar to power supply lines Vcc1 and Vss1, signal lines SO and $\overline{SO}$ are disposed along a direction perpendicular to bit line pairs BL and $\overline{BL}$.

A plurality of column selecting lines CSL connected to column decoder 4d are disposed parallel to bit line pairs BL and $\overline{BL}$ so as to traverse subarray. Between the regions of the plurality of column selecting lines CSL, a plurality of power supply lines Vcc2 and Vss2 are alternately disposed so as to traverse subarray 3. Power supply lines Vcc2 and Vss2 are connected at the crossings with power supply lines Vcc1 and Vss1 via a contact hole, through hole, etc.

Figure 6:
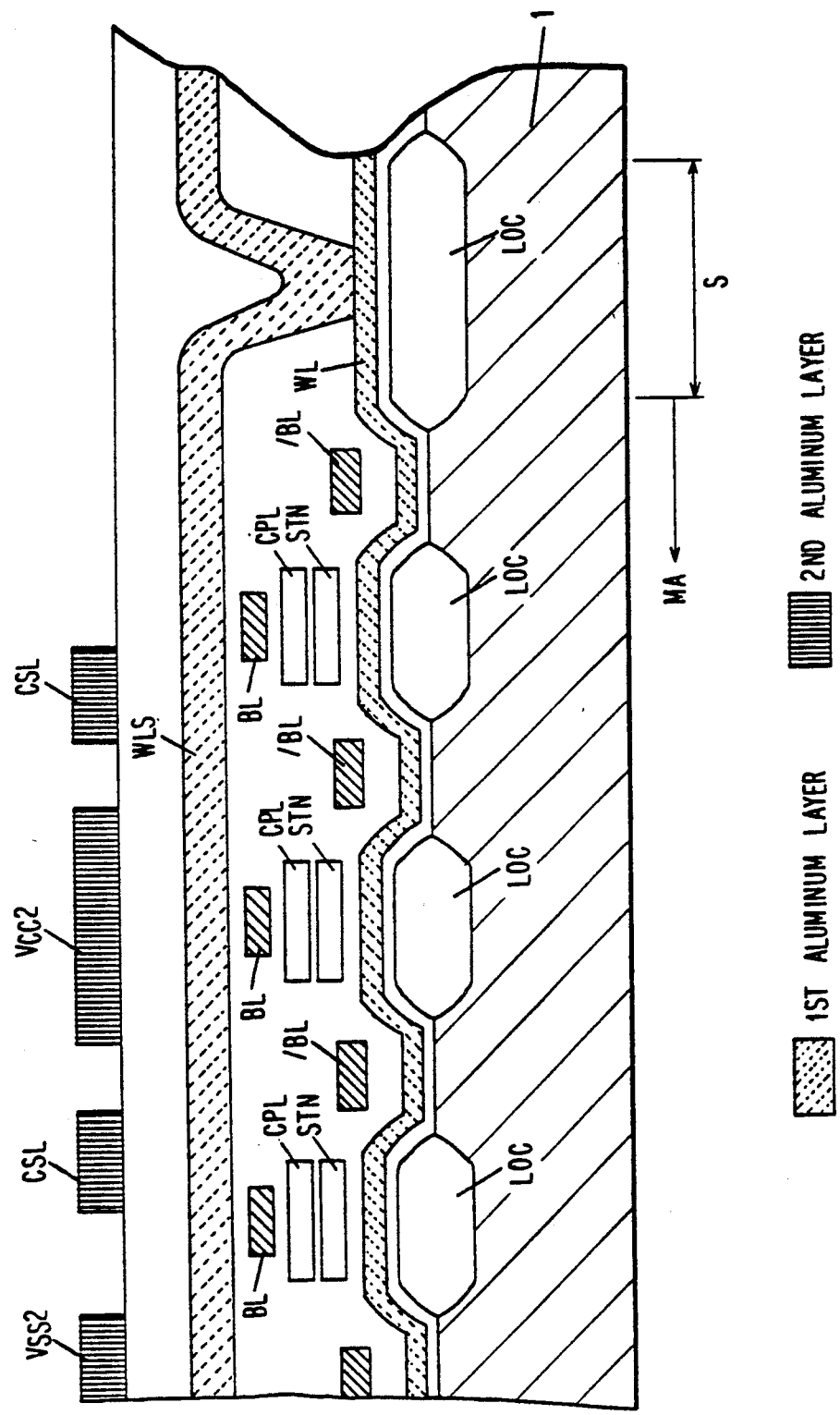
FIG. 6 is a partial sectional view of the subarray shown in FIG. 5.

FIG. 6 shows a partial sectional view of shunt region S and its peripheral region of subarray 3 of FIG. 5.

Referring to FIG. 6, power supply lines Vcc2 and Vss2 are disposed in the region between column selecting lines CSL on memory cell region MA. Shunt interconnection WLS is formed of a first aluminum layer, and column selecting line CSL and power supply lines Vcc2 and Vss2 are formed of a second aluminum layer. The power supply lines Vcc1 and Vss1, sense amplifier drive lines SP and SN, and signal lines $\overline{SO}$ and SO shown in FIG. 5 are formed of a first aluminum layer.

In the above-described embodiment, power supply lines Vcc1 and Vss1 extend in parallel to sense amplifier train 60, and a pair of continuing sense amplifier drive lines SP and SN are connected to power supply lines Vcc1 and Vss1 by a plurality of pairs of drive transistors 7 and 8. Therefore, the distance from power supply lines Vcc1 and Vss1 to each sense amplifier 6 is reduced and equal. The efficient number of sense amplifier 6 connected to each drive transistors 7 and 8 is reduced.

Therefore, variation in sensing time depending on the location of sense amplifier 6 is eliminated, and pull up/pull down of the potential of sense amplifier drive lines SP and SN by drive transistors 7 and 8 can be carried out sufficiently. As a result, proper sense operation is ensured.

Similar to column selecting line CSL, power supply lines Vcc2 and Vss2 are formed of a second aluminum layer in the region between column selecting lines CSL. Therefore, additional region for power supply lines Vcc2 and Vss2 is not required and the width of power supply lines Vcc2 and Vss2 can be broadened. By virtue of these power supply lines Vcc2 and Vss2, the provision of potentials of power supply lines Vcc1 and Vss1 is made sufficient.

(4) Another Embodiment of Chip Layout

Figure 7:
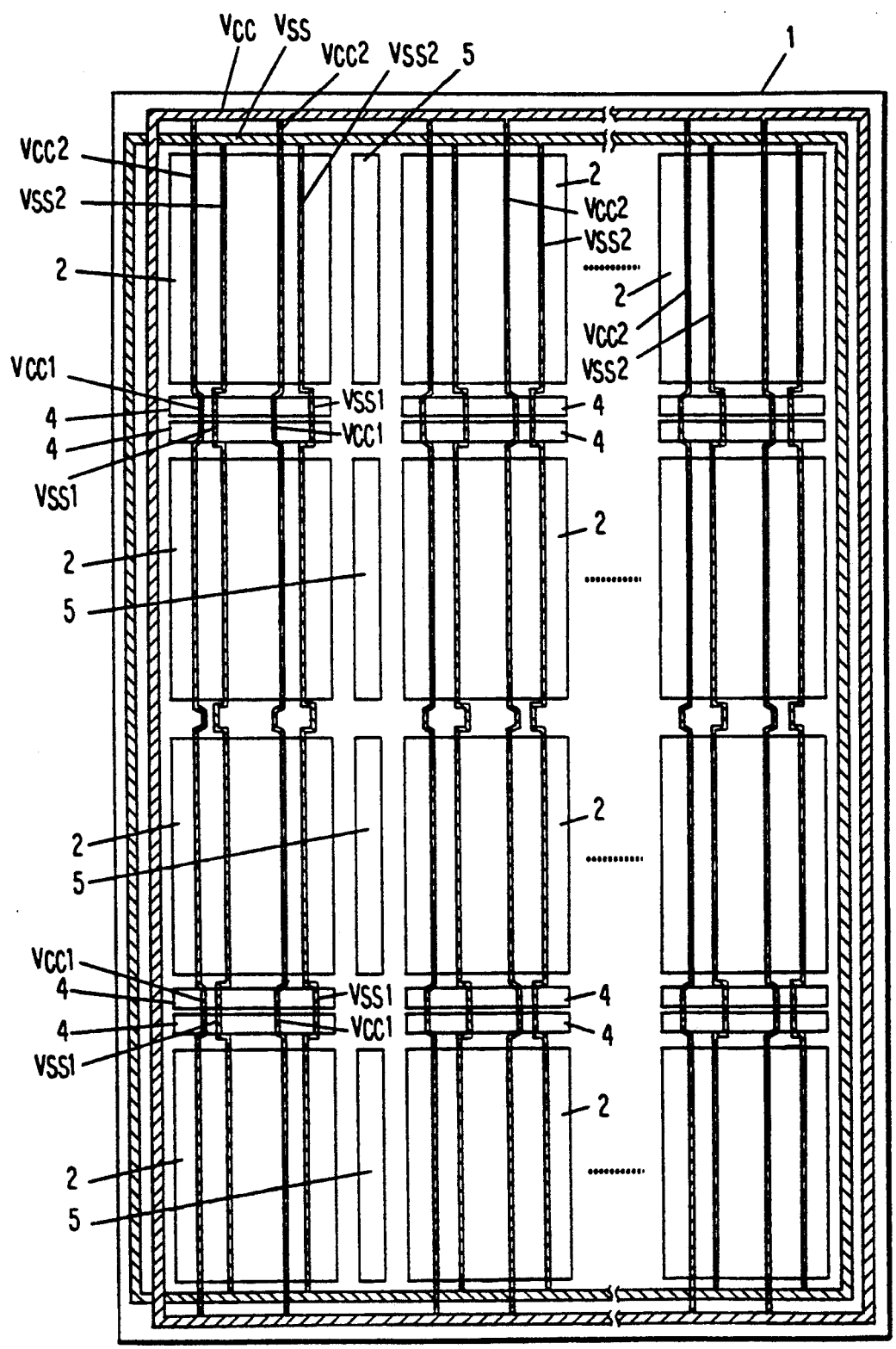
FIG. 7 is a diagram showing another example of a chip layout.
Figure 8:
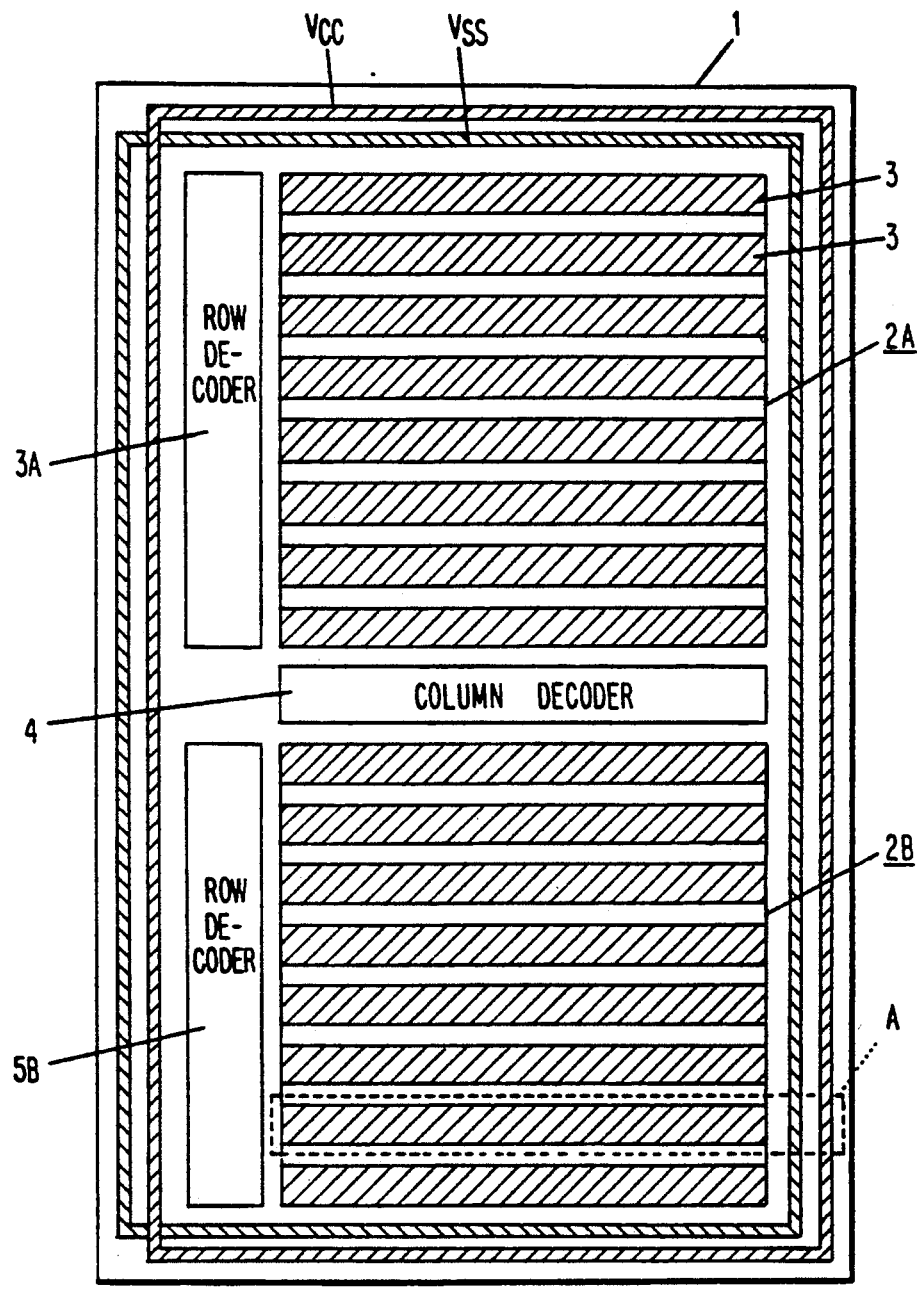
FIG. 8 is a diagram showing a chip layout of a conventional DRAM.
Figure 9:
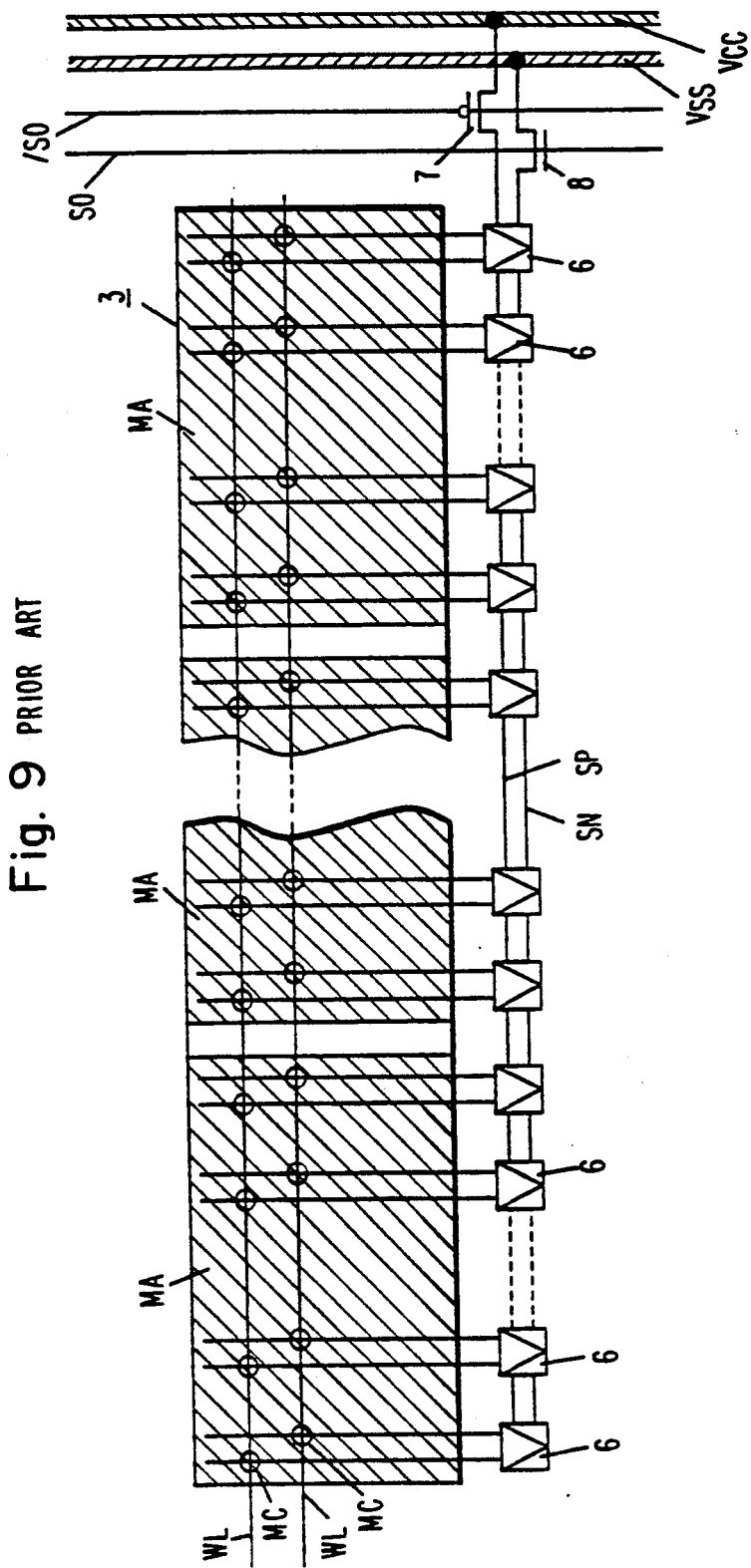
FIG. 9 is a diagram showing in detail a structure of a portion of the DRAM of FIG. 8.
Figure 10:
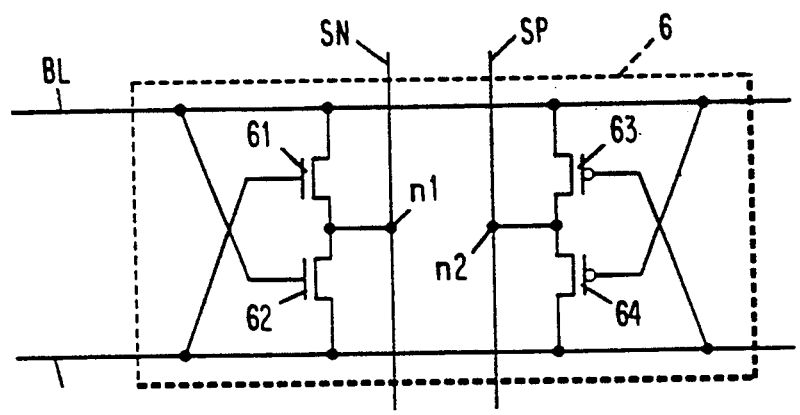
FIG. 10 is a circuit diagram showing a structure of a sense amplifier.

Although four memory array blocks 2a, 2b, 2c and 2d are provided on the semiconductor substrate 1, as shown in FIG. 1 in the above described first, second, and third embodiments, the number of memory array blocks are not limited to four, and many memory array blocks 2 may be provided on semiconductor substrate 1, as shown in FIG. 7.

The embodiment of FIG. 7 has power supply lines Vcc and Vss provided at the peripheral edge of semiconductor substrate 1. A plurality of power supply lines parallel to the bit line (not shown) traverses the plurality of memory array blocks 2 and the plurality of logic peripheral circuits to continuously extend from one of the shorter side of power supply lines Vcc and Vss of semiconductor substrate 1 to the other shorter side of power supply lines Vcc and Vss of semiconductor substrate 1.

Power supply lines Vcc2 and Vss2 formed of a second aluminum layer on memory array block 2 is connected to power supply lines Vcc1 and Vss1 formed of a first aluminum layer in the logic peripheral circuit.

Although the power supply line continuously extending from one shorter side to the other shorter side of semiconductor substrate 1 is formed of different interconnection materials in the embodiment of FIG. 7, these power supply lines may be formed of the same interconnection material using space on the logic peripheral circuit.

In the above embodiment, leading wire is not required for providing power supply potential from the longer side of the power supply lines Vcc and Vss of semiconductor substrate 1 to power supply lines Vcc2 and Vss2 traversing each memory array 2. Therefore, the area required for leading wires can be reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device formed on a semiconductor substrate, comprising:
   a memory array including a plurality of subarrays arranged along a first direction,
   a plurality of sense amplifier groups provided corresponding to said plurality of subarrays,
   a power supply line for receiving a predetermined power supply potential, and
   a plurality of drive means provided corresponding to said plurality of sense amplifier groups, each receiving said power supply potential of said power supply line for driving a corresponding sense amplifier group,
   wherein each of said plurality of subarrays comprises a plurality of bit lines disposed parallel to said first direction, a plurality of word lines crossing said plurality of bit lines and a plurality of memory cells provided at crossings of said plurality of bit lines and said plurality of word lines,
   wherein each of said plurality of sense amplifier groups comprises a plurality of sense amplifiers each connected to a corresponding bit line, said plurality of sense amplifiers being arranged along a second direction perpendicular to said first direction,
   wherein said power supply line comprises a main power supply line arranged along four edges of said semiconductor substrate, a plurality of first interconnection lines provided corresponding to said plurality of subarrays, each of said plurality of first interconnection lines being arranged parallel to said second direction at the side of corresponding subarray, and a second interconnection line arranged between two edges of said semiconductor substrate along said first direction, and connected to said main power supply line at one edge of said semiconductor substrate along said second direction and said plurality of first interconnection lines,
   wherein each of said plurality of drive means comprises a plurality of drive circuits each connected between a predetermined number of sense amplifiers in a corresponding sense amplifier group and a corresponding first interconnection line.

2. The semiconductor memory device according to claim 1, wherein each of said plurality of drive circuits is connected to one sense amplifier in a corresponding sense amplifier group.

3. The semiconductor memory device according to claim 1, wherein each of said plurality of drive circuits is connected to a predetermined number of or all of sense amplifiers in a corresponding sense amplifier group via a drive line.

4. The semiconductor memory device according to claim 1, wherein said second interconnection line disposed to traverse said memory array.

5. A semiconductor memory device formed on a semiconductor substrate, comprising:
   a memory array including a plurality of subarrays arranged along a first direction, each of said plurality of subarrays divided into a plurality of memory cell regions arranged along a second direction perpendicular to said first direction, whereby a predetermined region is formed extending along said first direction between said plurality of memory cell regions,
   a plurality of sense amplifier groups provided corresponding to said plurality of subarrays, a power supply line for receiving a predetermined power supply potential, and a plurality of drive means provided corresponding to said plurality of sense amplifier groups, each receiving said power supply potential of said power supply line for driving a corresponding sense amplifier group, wherein each of said plurality of subarrays comprises a plurality of bit lines disposed parallel to said first direction, a plurality of word lines crossing said plurality of bit lines, a plurality of memory cells provided at crossings of said plurality of bit lines and said plurality of word lines, and a plurality of shunt interconnection lines provided corresponding to said plurality of word lines, each of said plurality of shunt interconnection lines disposed along a corresponding word line and connected to a corresponding word line in said predetermined region, wherein each of said plurality of sense amplifier groups comprises a plurality of sense amplifiers each connected to a corresponding bit line, said plurality of sense amplifiers being arranged along said second direction, wherein said power supply line comprises a plurality of first interconnection lines provided corresponding to said plurality of subarrays, each of said plurality of first interconnection lines being arranged parallel to said second direction at the side of corresponding subarray, and a second interconnection line arranged in said predetermined region and connected to said plurality of first interconnection lines, wherein each of said plurality of drive means comprises a plurality of drive circuits each connected between a predetermined number of sense amplifiers in a corresponding sense amplifier group and a corresponding first interconnection line.

6. The semiconductor memory device according to claim 5, wherein said plurality of shunt interconnection lines and said plurality of first interconnection lines are formed of a first metal layer, said second interconnection line is formed of a second metal layer.

7. A semiconductor memory device formed on a semiconductor substrate, comprising:

a memory array including a plurality of subarrays arranged along a first direction, each of said plurality of subarrays comprising a plurality of bit lines disposed parallel to said first direction, a plurality of word lines crossing said plurality of bit lines and a plurality of memory cells provided at crossings of said plurality of bit lines and said plurality of word lines, a plurality of sense amplifier groups provided corresponding to said plurality of subarrays, each of said plurality of sense amplifier groups comprising a plurality of sense amplifiers each connected to a corresponding bit line, said plurality of sense amplifiers being arranged along a second direction perpendicular to said first direction, a plurality of column selecting lines disposed parallel to said first direction so as to traverse said plurality of subarrays for selecting any of said plurality of bit lines in said plurality of subarrays, a power supply line, for receiving a predetermined power supply potential, comprising a plurality of first interconnection lines provided corresponding to said plurality of subarrays, each of said plurality of first interconnection lines being arranged parallel to said second direction at the side of corresponding subarray, and a second interconnection line arranged between neighboring two column selecting lines of said plurality of column selecting lines and connected to said plurality of first interconnection lines, and a plurality of drive means provided corresponding to said plurality of sense amplifier groups, each of said plurality of drive means comprising a plurality of drive circuits each connected between the predetermined number of sense amplifiers in a corresponding sense amplifier group and a corresponding first interconnection line.

8. The semiconductor memory device according to claim 7, wherein said plurality of first interconnection lines are formed of a first metal layer, and said plurality of column selecting lines and said second interconnection line are formed of a second metal layer.

9. The semiconductor memory device according to claim 1, wherein each of said plurality of drive circuits comprises a MOS transistor.

10. The semiconductor memory device according to claim 1, wherein said plurality of bit lines in said plurality of subarrays implement a plurality of bit line pairs, wherein each of said plurality of sense amplifiers in said plurality of sense amplifier groups is connected to one bit line pair.

11. A semiconductor memory device formed on a semiconductor substrate, comprising:

a memory array including a plurality of subarrays arranged along a first direction, a plurality of sense amplifier groups provided corresponding to said plurality of subarrays, a power supply line for receiving a predetermined power supply potential, and a plurality of drive means provided corresponding to said plurality of sense amplifier groups, each receiving said power supply potential of said power supply line for driving a corresponding sense amplifier group, wherein each of said plurality of subarrays comprises a plurality of bit lines disposed parallel to said first direction, a plurality of word lines crossing said plurality of bit lines, and a plurality of memory cells provided at crossings of said plurality of bit lines and said plurality of word lines, said subarray being divided into a plurality of memory cell regions arranged along a second direction perpendicular to said first direction, wherein each of said plurality of sense amplifier groups comprises a plurality of sense amplifiers each connected to a corresponding bit line, said plurality of sense amplifiers being arranged along said second direction, wherein said power supply line comprises a plurality of first interconnection lines provided corresponding to said plurality of sense amplifier groups, each of said plurality of first interconnection lines being arranged parallel to said second direction near a corresponding sense amplifier group, wherein each of said plurality of drive means arranges near a corresponding sense amplifier group and comprises a plurality of drive circuits provided corresponding to a plurality of memory cell regions in a corresponding subarray, wherein each of said plurality of drive circuits is connected between the plurality of sense amplifiers connected to a corresponding memory cell region and a corresponding first 12. The semiconductor memory device according to claim 11, wherein each of said plurality of drive circuits is connected via a drive line SP, SN to all of sense amplifiers connected to a corresponding memory cell region.

13. The semiconductor memory device according to claim 11, wherein each of said plurality of drive circuits is connected via a drive line SP, SN to a predetermined number of or all of sense amplifiers connected to a corresponding subarray.

14. The semiconductor memory device formed on a semiconductor substrate, comprising:

a memory array including a plurality of subarrays arranged along a first direction, a plurality of sense amplifier groups provided corresponding to said plurality of subarrays, a power supply line for receiving a predetermined power supply potential, and a plurality of drive means provided corresponding to said plurality of sense amplifier groups, each receiving said power supply potential of said power supply line for driving a corresponding sense amplifier group, wherein each of said plurality of subarrays comprises a plurality of bit lines disposed parallel to said first direction, a plurality of word lines crossing said plurality of bit lines and a plurality of memory cells provided at crossings of said plurality of bit lines and said plurality of word lines, said subarray being divided into a plurality of memory cell regions arranged along a second direction perpendicular to said first direction, wherein each of said plurality of sense amplifier groups comprises a plurality of sense amplifiers each connected to a corresponding bit line, said plurality of sense amplifiers being arranged along said second direction, wherein said power supply line comprises a plurality of first interconnection lines provided corresponding to said plurality of subarrays, each of said plurality of first interconnection lines being arranged parallel to said second direction at the side of corresponding subarray, and a second interconnection line disposed parallel to said first direction so as to traverse said memory array, said second interconnection being connected to said plurality of first interconnection lines, wherein each of said plurality of drive means comprises a plurality of drive circuits provided corresponding to a plurality of memory cell regions in a corresponding subarray, wherein each of said plurality of drive circuits is connected between the plurality of sense amplifiers connected to a corresponding memory cell region and a corresponding first interconnection line.

15. A semiconductor memory device to claim 14, further comprising a plurality of shunt interconnections provided corresponding to said plurality of word lines, each arranged along a corresponding word line, formed on a semiconductor substrate, comprising:

a memory array including a plurality of subarrays along a first direction, each of said plurality of subarrays divided into a plurality of memory cell regions arranged along a second direction perpendicular to said first direction, whereby a predetermined region is formed extending along said first direction between said plurality of memory cell regions, a plurality of sense amplifier groups provided corresponding to said plurality of subarrays, a power supply line for receiving a predetermined power supply potential, and a plurality of drive means provided corresponding to said plurality of sense amplifier groups, each receiving said power supply potential of said power supply line for driving a corresponding sense amplifier group, wherein each of said plurality of subarrays comprises a plurality of bit lines disposed parallel to said first direction, a plurality of word lines crossing said plurality of bit lines, a plurality of memory cells provided at crossings of said plurality of bit lines and said plurality of word lines, and a plurality of shunt interconnection lines provided corresponding to said plurality of word lines, each of said plurality of shunt interconnection lines disposed along a corresponding word line and connected to a corresponding word line in said predetermined region, wherein each of said plurality of sense amplifier groups comprises a plurality of sense amplifiers each connected to a corresponding bit line, said plurality of sense amplifiers being arranged along said second direction, wherein said power supply line comprises a plurality of first interconnection lines provided corresponding to said plurality of subarrays, each of said plurality of first interconnection lines being arranged parallel to said second direction at the side of corresponding subarray, and a second interconnection line disposed in said predetermined region and connected to said plurality of first interconnection lines, wherein each of said plurality of drive means comprises a plurality of drive circuits provided corresponding to a plurality of memory cell regions in a corresponding subarray, wherein each of said plurality of drive circuits is connected between a plurality of sense amplifiers connected to a corresponding memory cell region and a corresponding first interconnection line.

16. The semiconductor memory device according to claim 15, wherein said plurality of shunt interconnection lines and said plurality of first interconnection lines are formed of a first metal layer, said second interconnection line is formed of a second metal layer.

17. A semiconductor memory device formed on a semiconductor substrate, comprising:

a memory array including a plurality of subarrays arranged along a first direction, each of said plurality of subarrays comprising a plurality of bit lines disposed parallel to said first direction, a plurality of word lines crossing said plurality of bit lines and a plurality of memory cells provided at crossing of said plurality of bit lines and said plurality of word lines, said subarray being divided into a plurality of memory cell regions arranged along a second direction perpendicular to said first direction, a plurality of sense amplifier groups provided corresponding to said plurality of subarrays, each of said plurality of sense amplifier groups comprising a plurality of sense amplifiers each connected to a corresponding bit line, said plurality of sense amplifiers being arranged along said second direction, a plurality of column selecting lines disposed parallel to said first direction so as to traverse said plurality of subarrays for selecting any of said plurality of bit lines in said plurality of subarrays, a power supply line, for receiving a predetermined power supply potential, comprising a plurality of first interconnection lines provided corresponding to said plurality of subarrays, each of said plurality of first interconnection lines being arranged parallel to said second direction at the side of corresponding subarrays, and a second interconnection line disposed between neighboring two column selecting lines of said plurality of column selecting lines and connected to said plurality of first interconnection lines, and a plurality of drive means provided corresponding to said plurality of sense amplifier groups, each of said plurality of drive means comprising a plurality of drive circuits provided corresponding to a plurality of memory cell regions in a corresponding subarray and each connected between a plurality of sense amplifiers connected to a corresponding memory cell region and a corresponding first interconnection line.

18. The semiconductor memory device according to claim 17, wherein said plurality of first interconnection lines are formed of a first metal layer, and said plurality of column selecting lines and said second interconnection line are formed of a second metal layer.

19. The semiconductor memory device according to claim 11, wherein each of said plurality of drive circuits comprises a MOS transistor.

20. The semiconductor memory device according to claim 11, wherein said plurality of bit lines in said plurality of subarrays implement a plurality of bit line pairs, wherein each of said plurality of sense amplifiers in said plurality of sense amplifier groups is connected to one bit line pair.

21. A semiconductor memory device formed on a semiconductor substrate, comprising:

a plurality of memory array blocks arranged along a first direction, each o said plurality of memory array blocks comprising a plurality of subarrays arranged along said first direction, a plurality of sense amplifier groups provided corresponding to said plurality of subarrays, a power supply line for receiving a predetermined power supply potential, a plurality of drive circuits provided corresponding to said plurality of sense amplifier groups, each receiving said power supply potential of said power supply line for driving a corresponding sense amplifier group, and logic peripheral circuit means provided between two adjacent memory array blocks, wherein each of said plurality of subarrays comprises a plurality of bit lines disposed parallel to said first direction, a plurality of word lines crossing said plurality of bit lines, and a plurality of memory cells provided at crossings of said plurality of bit lines and said plurality of word lines, wherein each of said plurality of sense amplifier groups comprises a plurality of sense amplifiers each connected to a corresponding bit line, said plurality of sense amplifiers being arranged along a second direction perpendicular to said first direction, wherein said power supply line comprises a plurality of first interconnection lines disposed parallel to said second direction at the side of the plurality of subarrays, and a second interconnection line disposed parallel to said first direction so as to traverse said plurality of memory arrays and said logic peripheral circuit means and connected to said plurality of first interconnection lines, wherein each of said plurality of drive means comprises a plurality of drive circuits each connected between a predetermined number of sense amplifiers in a corresponding sense amplifier group and a corresponding first interconnection line.

22. A semiconductor memory device formed on a semiconductor substrate, comprising:

a plurality of memory array blocks arranged along a first direction, each of said plurality of memory array blocks comprising a plurality of subarrays arranged along said first direction, each of said plurality of subarrays divided into a plurality of memory cell regions arranged along a second direction perpendicular to said first direction, whereby a predetermined region is formed extending along said first direction between said plurality of memory cell regions, a plurality of sense amplifier groups provided corresponding to said plurality of subarrays, a power supply line for receiving a predetermined power supply potential, a plurality of drive means provided corresponding to said plurality of sense amplifier groups, each receiving said power supply potential of said power supply line for driving a corresponding sense amplifier group, and logic peripheral circuit means provided between two adjacent memory array blocks, wherein each of said plurality of subarrays comprises a plurality of bit lines disposed parallel to said first direction, a plurality of word lines crossing said plurality of bit lines, a plurality of memory cells provided at crossings of said plurality of bit lines and said plurality of word lines, and a plurality of shunt interconnection lines provided corresponding to said plurality of word lines, each of said plurality of shunt interconnection lines disposed along a corresponding word line and connected to a corresponding word line in said predetermined region, wherein each of said plurality of sense amplifier groups comprises a plurality of sense amplifiers each connected to a corresponding bit line, said plurality of sense amplifiers being arranged along said second direction, wherein said power supply line comprises a plurality of first interconnection lines disposed parallel to said second direction at the side of the plurality of subarray, and a second interconnection line disposed parallel to said first direction in said predetermined region so as to traverse said plurality of memory arrays and said logic peripheral circuit means and connected to said plurality of first interconnection lines, wherein each of said plurality of drive means comprises a plurality of drive circuits each connected between a predetermined number of sense amplifier in a corresponding sense amplifier group and a corresponding first interconnection line.

23. The semiconductor memory device according to claim 22, wherein said plurality of shunt interconnection lines and said plurality of first interconnection line are formed of a first metal layer, and said second interconnection line is formed of a second metal layer.

24. The semiconductor memory device according to claim 22, wherein said second interconnection line is formed of a second metal layer in said plurality of memory arrays and of a first metal layer in said logic peripheral circuit means.

25. A semiconductor memory device formed on a semiconductor substrate, comprising:

a plurality of memory array blocks arranged along a first direction, each of said plurality of memory array blocks comprising a plurality of subarrays arranged along said first direction, each of said plurality of subarrays comprising a plurality of bit lines disposed parallel to said first direction, a plurality of word lines crossing said plurality of bit lines and a plurality of memory cells provided at crossings of said plurality of bit lines and said plurality of word lines, a plurality of sense amplifier groups provided corresponding to said plurality of subarrays, each of said plurality of sense amplifier groups comprising a plurality of sense amplifiers each connected to a corresponding bit line, said plurality of sense amplifiers being arranged along a second direction perpendicular to said first direction, a plurality of column selecting lines provided disposed parallel to said first direction so as to traverse the plurality of subarrays for selecting any of said plurality of bit lines in said plurality of subarrays, a power supply line, for receiving a predetermined power supply potential, comprising a plurality of first interconnection lines provided corresponding to said plurality of subarrays, each of said plurality of first interconnection lines being arranged parallel to said second direction at the side of corresponding subarray, and a second interconnection lines being arranged parallel to said second direction at the side of corresponding subarray, and a second interconnection line disposed between neighboring two column selecting lines of said plurality of column selecting lines so as to traverse said plurality of memory arrays and said logic peripheral circuit means and connected to said plurality of first interconnection lines, and a plurality of drive means provided corresponding to said plurality of sense amplifier groups, each of said plurality of drive means comprising a plurality of drive circuits each connected between the predetermined number of sense amplifiers in a corresponding sense amplifier group and a corresponding first interconnection line.

26. The semiconductor memory device according to claim 25, wherein said plurality of first interconnection lines are formed of a first metal layer, and said plurality of column selecting lines and said second interconnection line are formed of a second metal layer.

27. The semiconductor memory device according to claim 25, wherein said second interconnection line is formed of a second metal layer in said plurality of memory arrays and of the first metal layer in said logic peripheral circuit means.

28. A semiconductor memory device comprising:

a semiconductor substrate including a plurality of memory cell formation regions and a plurality of sense amplifier formation regions, wherein a memory cell formation region and a sense amplifier formation region are arranged alternately along a column direction, a plurality of memory cells disposed in a matrix of a plurality of rows and columns in each memory cell formation region of said semiconductor substrate, a plurality of word lines disposed in a plurality of rows on each memory cell formation region of said semiconductor substrate, each connected to a plurality of memory cells disposed in a corresponding row, a plurality of bit line pairs disposed in a plurality of columns on each memory cell formation region of said semiconductor substrate, each connected to a plurality of memory cells arranged in a corresponding column, a plurality of sense amplifiers disposed along a row direction in each sense amplifier formation region of said semiconductor substrate, each detecting the potential difference on a corresponding bit line pair, a power supply line including a plurality of first interconnection lines disposed parallel to the row direction on each sense amplifier formation region of said semiconductor substrate for receiving a predetermined supply potential, and a plurality of drive circuits disposed along the row direction on each sense amplifier formation region of said semiconductor substrate, each connected between a predetermined number of sense amplifiers formed on a corresponding sense amplifier formation region and a first interconnection line formed on a corresponding sense amplifier formation region.

29. The semiconductor memory device according to claim 28, wherein said power supply line further comprises a second interconnection line disposed parallel to the column direction and over said plurality of memory cell formation regions and said plurality of sense amplifier formation regions, and connected to said plurality of first interconnection lines.

30. A semiconductor memory device comprising:

a semiconductor substrate including a plurality of memory cell formation regions and a plurality of sense amplifier formation regions, wherein a memory cell formation regions and a sense amplifier formation region are arranged alternately along a column direction, a plurality of memory cells arranged in a matrix of a plurality of rows and columns in each memory cell formation region of said semiconductor substrate, a plurality of word lines disposed in a plurality of rows on each memory cell formation regions of said semiconductor substrate, each connected to a plurality of memory cells disposed in a corresponding rows, a plurality of bit line pairs disposed in a plurality of columns on each memory cell formation region of said semiconductor substrate, each connected to a plurality of memory cells arranged in a corresponding column, a plurality of sense amplifiers disposed along a row direction in each sense amplifier formation region of said semiconductor substrate, each detecting the potential difference on a corresponding bit line pair, a drive line disposed parallel to the row direction in each sense amplifier formation region of said semiconductor substrate, and connected to a power supply node of a plurality of sense amplifiers arranged in a corresponding sense amplifier formation region, a power supply line including a plurality of first interconnection lines disposed parallel to the row direction on each sense amplifier formation region of said semiconductor substrate for receiving a predetermined supply potential, and a plurality of drive circuits disposed along the row direction on each sense amplifier formation region of said semiconductor substrate, each connected between a drive line formed on a corresponding sense amplifier formation region and a first interconnection line formed on a corresponding sense amplifier formation region.

31. A semiconductor memory device comprising:

a semiconductor substrate including a plurality of memory cell formation regions and a plurality of sense amplifier formation regions, wherein a memory cell formation region and a sense amplifier formation regions are arranged alternately along a column direction, each of said plurality of memory cell formation regions including a plurality of memory cell formation portions and a plurality of shunt regions arranged alternately along a row direction, a plurality of memory cells disposed in a matrix of a plurality of rows and columns in a memory cell formation region of each memory cell formation region of said semiconductor substrate, a plurality of word lines disposed in a plurality of rows on each memory cell formation region of said semiconductor substrate, each connected to a plurality of memory cells arranged in a corresponding row, a plurality of shunt interconnection lines provided in parallel corresponding to said plurality of word lines on each memory cell formation region of said semiconductor substrate, each connected to a corresponding word line on a plurality of shunt regions of a corresponding memory cell formation region, a plurality of bit line pairs disposed in a plurality of columns on each memory cell formation region of said semiconductor substrate, each connected to a plurality of memory cells arranged in a corresponding column, a plurality of sense amplifiers disposed along the row direction in each sense amplifier formation region of said semiconductor substrate, each detecting the potential deference on a corresponding bit line pair, a power supply line for receiving a predetermined supply potential, including a plurality of first interconnection lines disclosed parallel to the row direction on each sense amplifier formation region of said semiconductor substrate, and a second interconnection line disposed parallel to the column direction on a shunt region of said plurality of first interconnection lines, and a plurality of drive circuits disposed along the row direction on each sense amplifier formation region of said semiconductor substrate, each connected between a predetermined number of sense amplifiers formed on a corresponding sense amplifier formation region and a first interconnection line formed on a corresponding sense amplifier formation region.

32. The semiconductor memory device according to claim 31, wherein said shunt interconnection lines and the first interconnection lines of said power supply lines are formed of a metal layer of the same level.

33. A semiconductor memory device comprising:

a semiconductor substrate including a plurality of memory cell formation regions and a plurality of sense amplifier formation regions, wherein a memory cell formation region and a sense amplifier formation region are arranged alternately along a column direction, a plurality of memory cells arranged in a matrix of a plurality of rows and columns in each memory cell formation region of said semiconductor substrate, a plurality of word lines disposed in a plurality of rows on each memory cell formation region of said semiconductor substrate, each connected to a plurality of memory cells arranged in a corresponding row, a plurality of bit line pairs disposed in a plurality of columns on each memory cell formation region of said semiconductor substrate, each connected to a plurality of memory cells arranged in a corresponding column, a plurality of sense amplifiers disposed along the row direction in each sense amplifier formation region of said semiconductor substrate, each detecting the potential difference on a corresponding bit line pair, a plurality of column selecting lines disposed parallel to the column direction on said plurality of memory cell formation regions and said plurality of sense amplifier formation regions of said semiconductor substrate, and formed of a second metal layer for selecting any of said plurality of bit line pairs, a power supply line for receiving a predetermined supply potential, including a plurality of first interconnection lines of a first metal layer disposed parallel to the row direction on each sense amplifier formation region of said semiconductor substrate, and a second interconnection line of a second metal layer disposed parallel to said plurality of column selecting lines between two adjacent column selecting lines of said plurality of column selecting lines, and connected to said plurality of first interconnection lines, and a plurality of drive circuits disposed along the row direction on each sense amplifier formation region of said semiconductor substrate, each connected between a predetermined number of sense amplifiers formed on a corresponding sense amplifier formation region and a first interconnection line formed on a corresponding sense amplifier formation region.

34. The semiconductor memory device according to claim 33, wherein each memory cell formation region of said semiconductor substrate comprises a plurality of memory cell formation portions and a plurality of shunt regions disposed alternately along the row direction, further comprising a plurality of shunt interconnection lines of a first metal layer disposed in parallel corresponding to said plurality of word lines on each memory cell formation region of said semiconductor substrate, each connected to a corresponding word line on the plurality of shunt regions of a corresponding memory cell formation region, wherein said second interconnection line of said power supply line is located on a shunt region of said plurality of memory cell 35. A semiconductor memory device comprising:
a semiconductor substrate including a plurality of memory array block formation regions arranged along a column direction and a peripheral circuit formation region disposed between memory array block formation regions, wherein each of said plurality of memory array block formation regions includes a plurality of memory cell formation regions and a plurality of sense amplifier formation regions disposed alternately along the column direction, a plurality of memory cells arranged in a matrix of a plurality of rows and columns in each memory cell formation region of each memory array block formation region of said semiconductor substrate, a plurality of word lines disposed in a plurality of rows on each memory cell formation region of each memory array block formation region of said semiconductor substrate, each connected to a plurality of memory cells arranged in a corresponding row, a plurality of bit line pairs disposed in a plurality of columns on each memory cell formation region of each memory array block formation region of said semiconductor substrate, each connected to a plurality of memory cells arranged in a corresponding column, a plurality of sense amplifiers disposed along a row direction in each sense amplifier formation region of each memory array block formation region of said semiconductor substrate, each detecting the potential difference on a corresponding bit line pair, logic peripheral circuit means provided in a peripheral circuit formation region of said semiconductor substrate, a power supply line for receiving a predetermined supply potential, including a plurality of first interconnection lines disposed parallel to a row direction on each sense amplifier formation region of each memory array block formation region of said semiconductor substrate, and a second interconnection line disposed parallel to the column direction passing over said plurality of memory cell formation regions and said plurality of sense amplifier formation regions of said plurality of memory array block formation regions, and over said peripheral circuit formation region, and connected to said plurality of first interconnection lines and a plurality of drive circuit disposed along the row direction on each sense amplifier formation region of each memory array block formation region of said semiconductor substrate, each connected between a predetermined number of sense amplifiers formed on a corresponding sense amplifier formation region and a first interconnection line formed on a corresponding sense amplifier formation region.

36. The semiconductor memory device according to claim 35, wherein each memory cell formation region of said semiconductor substrate comprises a plurality of memory cell formation portions and a plurality of shunt regions disposed alternately along the row direction, further comprising a plurality of shunt interconnection lines disposed in parallel corresponding to said plurality of word lines on each memory cell formation region of said semiconductor substrate, each connected to a corresponding word line on a plurality of shunt regions of a corresponding memory cell formation region, wherein said second interconnection line of said power supply line is located on a shunt region of said plurality of memory cell formation regions.

37. The semiconductor memory device according to claim 36, wherein said plurality of shunt interconnection lines and said plurality of a first interconnection lines of said power supply line are formed of a first metal layer, wherein said second interconnection line of said power supply line is formed of a second metal layer on said plurality of memory array block formation regions and of a first metal layer on said peripheral circuit formation region.

38. The semiconductor memory device according to claim 35, further comprising a plurality of column selecting lines disposed parallel to the column direction on said plurality of memory cell formation regions and said plurality of sense amplifier formation regions of each memory array block formation region of said semiconductor substrate for selecting any of said plurality of bit line pairs, said second interconnection line of said power supply line being disposed parallel to said plurality of column selecting lines between two adjacent column selecting lines.

39. The semiconductor memory device according to claim 38, wherein said plurality of shunt interconnection lines and said plurality of first interconnection lines of said power supply line are formed of a first metal layer, wherein said column selecting lines are formed of a second metal layer, wherein said second interconnection line of said power supply line is formed of a second metal layer on said plurality of memory array block formation regions and a first metal layer on said peripheral circuit formation region.

40. A semiconductor memory device formed on a semiconductor substrate, comprising:
a memory array including a plurality of subarrays arranged along a first direction,
a plurality of sense amplifier groups, a power supply line for receiving a predetermined power supply potential, and a plurality of drive means provided corresponding to said plurality of sense amplifier groups, each receiving said power supply potential of said power supply line for driving a corresponding sense amplifier group, wherein each of said plurality of subarrays comprises a plurality of bit lines disposed parallel to said first direction, a plurality of word lines crossing said plurality of bit lines and a plurality of memory cells provided at crossings of said plurality of bit lines and said plurality of word lines, each of said plurality of sense amplifier groups comprises a plurality of sense amplifiers each connected to corresponding bit lines, said plurality of sense amplifiers being arranged along a second direction perpendicular to said first direction, said power supply line comprises a main power supply line arranged along four edges of said semiconductor substrate, a plurality of first interconnection lines, each being arranged parallel to said second direction at the side of each subarray, and a second interconnection line arranged between two edges of said semiconductor substrate along said first direction, and connected to said main power supply line at one edge of said semiconductor substrate along said second direction and said plurality of first interconnection lines, and each of said plurality of drive means comprises a plurality of drive circuits each connected between a predetermined number of sense amplifiers in a corresponding sense amplifier group and a corresponding first interconnection line.

* * * * *

UNITED STATES PATENT AND TRADEMARK OFFICE
CERTIFICATE OF CORRECTION

PATENT NO. : 5,321,646
DATED : June 14, 1994
INVENTOR(S) : Shigeki TOMISHIMA et al.

It is certified that error appears in the above-indentified patent and that said Letters Patent is hereby corrected as shown below:

Column 22, line 4, change "deference" to --difference--;
Column 22, line 12, after "plurality" insert --of memory cell formation regions and connected to said plurality--.

Signed and Sealed this

Thirty-first Day of January, 1995

Attest:

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,321,646
DATED : June 14, 1994
INVENTOR(S) : Shigeki TOMISHIMA et al.

It is certified that error appears in the above-indentified patent and that said Letters Patent is hereby corrected as shown below:

Column 21, line 50, change "region" to --portion--.

Signed and Sealed this

Twenty-fifth Day of July, 1995

Attest:

BRUCE LEHMAN

*Attesting Officer*     *Commissioner of Patents and Trademarks*